United States Patent
Kosugi et al.

(10) Patent No.: US 7,651,285 B2
(45) Date of Patent: Jan. 26, 2010

(54) EDGE EXPOSURE APPARATUS, COATING AND DEVELOPING APPARATUS, EDGE EXPOSURE METHOD AND COATING AND DEVELOPING METHOD, AND STORAGE MEDIUM

(75) Inventors: Hitoshi Kosugi, Koshi (JP); Taro Yamamoto, Koshi (JP); Yoshiaki Yamada, Tokyo (JP); Yasuhito Saiga, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 294 days.

(21) Appl. No.: 11/907,131

(22) Filed: Oct. 9, 2007

(65) Prior Publication Data

US 2008/0088809 A1    Apr. 17, 2008

(30) Foreign Application Priority Data

Oct. 13, 2006 (JP) .............................. 2006-280579

(51) Int. Cl.
*G03D 5/00* (2006.01)
*G03B 27/32* (2006.01)
*B05C 11/02* (2006.01)
(52) U.S. Cl. ............................ 396/611; 355/27; 118/52
(58) Field of Classification Search ................. 396/611; 355/27, 53, 67; 118/52; 356/400, 401
See application file for complete search history.

(56) References Cited

U.S. PATENT DOCUMENTS 4,910,549 A    3/1990 Sugita 6,052,173 A * 4/2000 Miura et al. .................. 355/53
2005/0062951 A1 * 3/2005 Akiyama et al. .............. 355/53

FOREIGN PATENT DOCUMENTS

| JP | 11-219894 | 8/1999 |
| JP | 2001-110712 | 4/2001 |
| JP | 2003-347187 | 12/2003 |

OTHER PUBLICATIONS

Translation of JP 2001-110712 (dated Apr. 20, 2001).*
Translation of JP 2003-347187 (dated Dec. 5, 2003).*

* cited by examiner

*Primary Examiner*—Alan A Mathews
(74) *Attorney, Agent, or Firm*—Smith, Gambrell & Russell, LLP

(57) ABSTRACT

An edge exposure apparatus performing an exposure process on an edge portion of a wafer having a coating film (resist film) formed thereon includes position detection means for detecting positional data of an outer edge of a wafer held by a spin chuck, an exposure portion for performing an exposure process on the edge portion of the wafer, a development nozzle supplying a developer to the exposed region, and alignment means for horizontally moving the spin chuck. An exposure process is performed by the exposure portion on the edge portion of the wafer held by the spin chuck while the alignment means is controlled, based on the positional data of the outer edge of the wafer which is detected by the position detection means, such that the positional relation between the outer edge of the wafer and the exposure portion is kept constant.

10 Claims, 12 Drawing Sheets

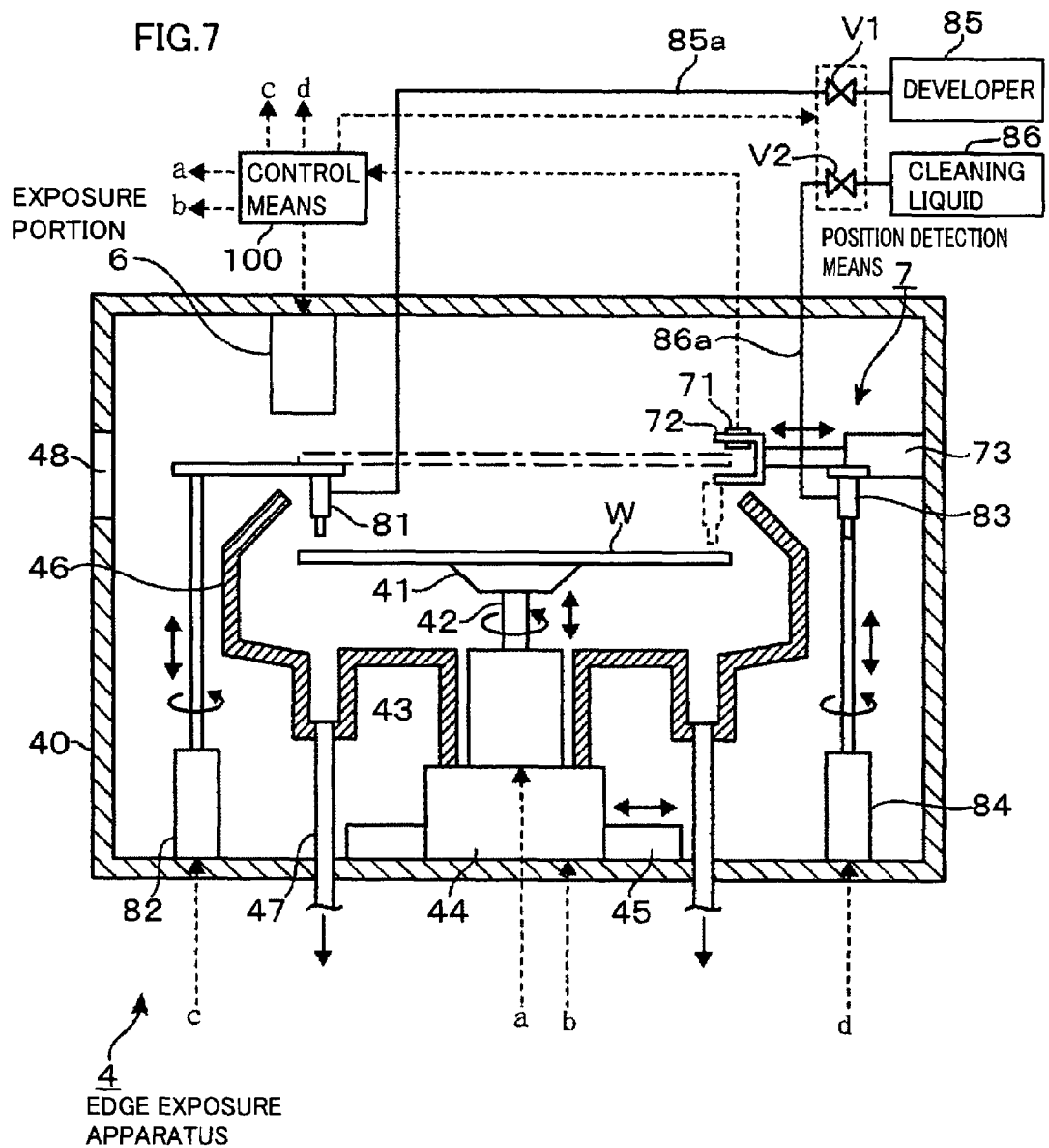

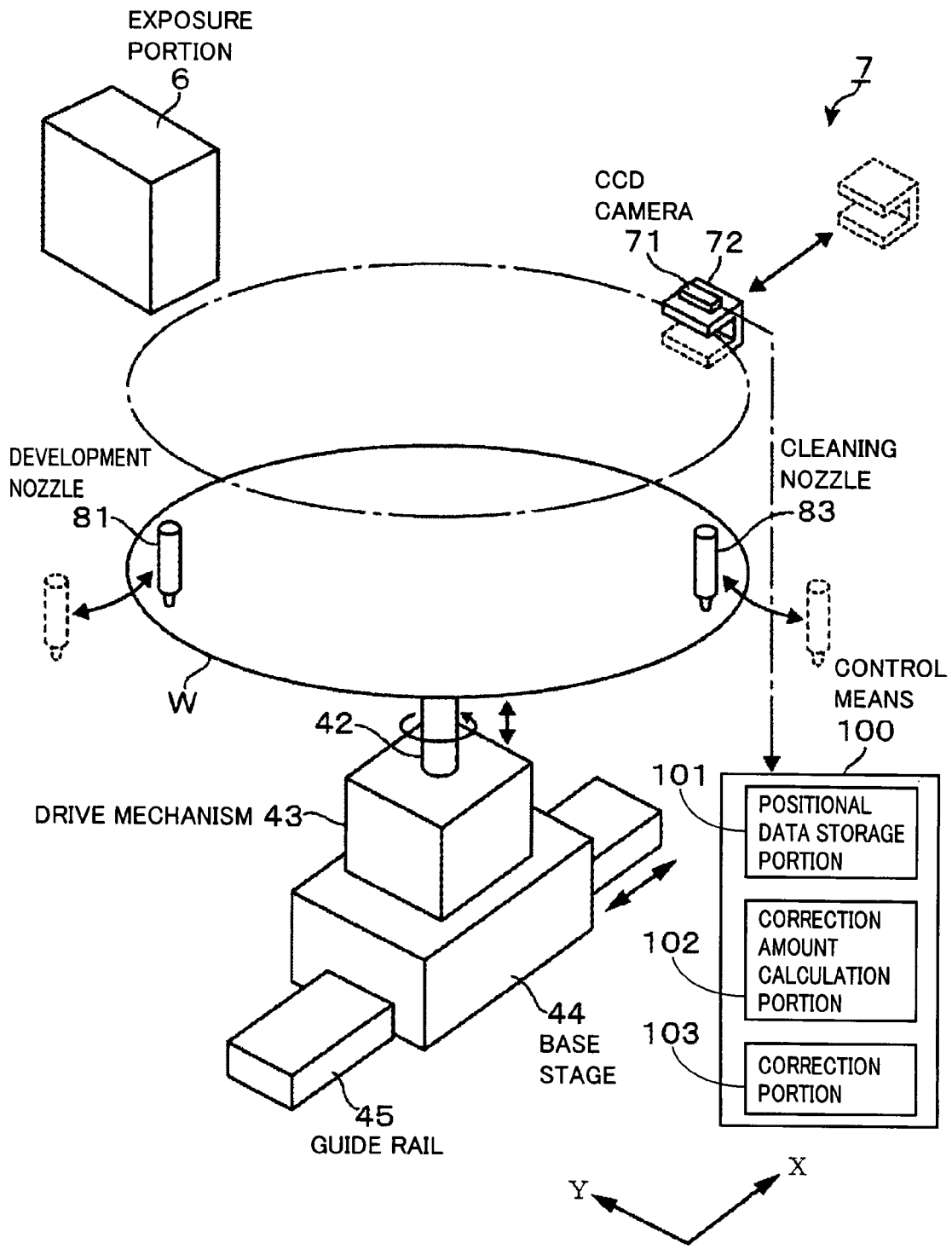

EDGE EXPOSURE APPARATUS, COATING AND DEVELOPING APPARATUS, EDGE EXPOSURE METHOD AND COATING AND DEVELOPING METHOD, AND STORAGE MEDIUM

BACKGROUND OF THE INVENTION

1. Field of the Invention

The present invention relates to a technique for removing an unnecessary coating film at an edge portion, for example, of a substrate having a coating film formed thereon.

2. Description of the Background Art

In a manufacturing process of semiconductor devices and LCD substrates, a resist pattern is formed on a substrate by a technique called photolithography. This technique is performed, for example, through a series of steps of applying a resist liquid on a substrate such as a semiconductor wafer (referred to as a wafer hereinafter), exposing the resist in a prescribed pattern, and thereafter performing a development process to obtain a desired pattern. Such a process is generally performed using a system in which an exposure apparatus is connected to a coating and developing apparatus for applying and developing a resist liquid.

Recently, as device patterns are increasingly reduced in size and film thickness, there is a growing demand for increasing the resolution of exposure. Then, for example, an approach of performing exposure with a light-transmitting liquid layer formed on a surface of a substrate (referred to as "liquid immersion exposure) has been developed by further improving exposure techniques using argon fluoride (ArF) or krypton fluoride (KrF) to increase the resolution. This liquid immersion exposure is a technique of, for example, allowing light to pass through pure water, and utilizes such a characteristic in that an optical wavelength is shorter in water and thus the wavelength of ArF of 193 nm is substantially 134 nm in water.

On the other hand, edge rinse for removing a resist film at an edge portion outside of a circuit formation region of a wafer has conventionally been performed after application of a resist liquid. The edge portion of the wafer has a beveled structure in order to be held by a transport arm. If a resist film is present here, the resist film adheres to the transport arm and then peels off from the transport arm in a transport step, resulting in particles which are a cause of defects. The particles scattering in the apparatus or being transferred to another wafer W become a factor contributing to particle contamination.

The aforementioned edge rinse is performed, for example, as shown in FIG. 13A, by applying a resist liquid on a surface of a wafer 10 to form a resist film 11, and thereafter discharging an organic solvent such as thinner from a nozzle 12 toward an edge portion of wafer 10. As disclosed in Japanese Patent Laying-Open No. 2001-110712, a coating film removing apparatus dedicated for an edge rinse step may be used for removing an unnecessary coating film at the edge portion of a wafer at high accuracy.

However, in the edge rinse using an organic solvent, because of the compatibility between organic solvents and coating films, with some kinds of resist film, it is difficult to sharply cut the resist film at the edge portion of the wafer in such a manner in that the end portion is linearly shaped. For example, as shown in FIG. 13B, because of the presence of a part 13 where the resist film rises like a knot or a part 14 where the dissolved component of the resist film drips into a region to be removed so that the resist film is left thinly in the vicinity of the outer edge of the wafer, the resist film is often cut bluntly. In particular, since the edge portion of wafer W has a beveled structure, the resist film is hardly removed and may remain on the inclined surface at the edge portion of wafer W.

In this state, in the liquid immersion exposure process as mentioned above, as shown in FIG. 13C, since the process is performed by moving an exposure portion 15 in a state in which wafer 10 and exposure portion 15 are in contact with each other with water 16 interposed therebetween, the presence of knot-like part 13 changes the water flow and the effect during movement of exposure portion 15, which may cause a phenomenon in which the resist film peels off from wafer 10. In addition, water 16 intrudes by capillarity between from wafer W and resist film 11 thinly left in the vicinity of the outer edge of the wafer, which may cause peeling of resist film 11, as shown in FIG. 13D. Moreover, for example, in a case where a plurality of coating films are stacked, for example, where an antireflection film is formed under resist film 11, water 16 easily intrudes in the neighborhood of the boundary between the antireflection film and resist film 11, and film peeling from that region may occur. It is reported that a coating film such as resist film 11, which peels off at the time of liquid immersion exposure process in this manner, attaches to wafer 10 again and is detected as a defect.

In the edge rinse using an organic solvent, because of the compatibility between the resist liquid and the organic solvent as described above, the accuracy of cut width of a film to be removed is deteriorated or the shape of the cut surface is deteriorated. In addition, for example, in the case where a plurality of coating films are stacked, for example, where an antireflection film is formed under the resist film, edge rinse of the underlying coating film is performed before the overlying coating film is formed. Therefore, in the underlying coating film, the cut width has to be set with allowance for the overlying coating film to be formed and thus a larger cut-width margin has to be set. As a result, the cut width becomes greater, and it is likely that the circuit formation region of wafer 10 is reduced accordingly.

Here, as a technique of removing the unnecessary resist film at the edge portion of the wafer, an edge exposure process may be performed. In this edge exposure, an exposure process is selectively performed on the unnecessary resist film at the edge portion of the wafer before an exposure process, for the purpose of removing the unnecessary resist film at the edge portion in the subsequent development step. According to this technique, since the resist film at the edge portion is optically removed, advantageously, the unnecessary resist film can be removed sharply in such a manner that the end portion is shaped linearly. However, since the unnecessary resist film at the edge portion cannot be removed without a development process after the exposure process, the resist film may attach to a transport arm and cause particles in the transport step before the development process, as described above. In addition, in the liquid immersion exposure process, the resist film present at the edge portion of the wafer comes in contact with water, which may cause film peeling.

In the above-noted Japanese Patent Laying-Open No. 2001-110712, an unnecessary coating film formed at the edge portion of a wafer is removed at high accuracy by positioning a rinsing liquid ejection portion based on detection of an outer edge position of a substrate. With the configuration of Japanese Patent Laying-Open No. 2001-110712, peeling of the resist film from wafer 10 in the liquid immersion exposure process cannot be solved.

SUMMARY OF THE INVENTION

The present invention is made under such circumstances. An object of the present invention is to provide a technique that allows an unnecessary coating film at an edge portion of a substrate to be removed with high accuracy of shape and width.

In accordance with the present invention, an edge exposure apparatus performing an exposure process on an edge portion of a substrate having a coating film formed thereon includes: a substrate holding portion horizontally holding a substrate having a coating film formed on a surface thereof; a position detection portion detecting positional data of an outer edge of the substrate held by the substrate holding portion; an edge exposure portion performing an exposure process on an edge portion of the substrate held by the substrate holding portion; a developer supply portion supplying a developer to an exposed region of the substrate held by the substrate holding portion and subjected to an exposure process at the edge portion, thereby dissolving and removing the coating film in the exposed region; an alignment portion moving the substrate held by the substrate holding portion and the edge exposure portion relatively horizontally to each other; and a control portion controlling the alignment portion such that a positional relation between the outer edge of the substrate and the edge exposure portion is kept constant, based on the positional data of the outer edge of the substrate, when an exposure process is performed by the edge exposure portion.

Here, the edge exposure apparatus may include a cleaning liquid supply portion supplying a cleaning liquid to the exposed region of the substrate held by the substrate holding portion and subjected to an exposure process at the edge portion thereby to clean the region.

A coating and developing apparatus in accordance with the present invention includes the edge exposure apparatus as described above. After a substrate carried into a carrier placement portion by a carrier is delivered to a processing portion and a coating film is formed on the substrate in the processing portion, an exposure process for an unnecessary coating film at an edge portion of the substrate and a development process for a region subjected to the exposure are performed in the edge exposure apparatus, the substrate is then transported to an exposure apparatus through an interface portion, and the substrate returned through the interface portion after an exposure process is subjected to a development process in the processing portion and delivered to the carrier placement portion.

Here, for example, as the exposure apparatus, an apparatus performing a liquid immersion exposure process of performing exposure by forming a liquid layer on a substrate surface may be used. Here, desirably, the edge exposure apparatus is provided in the interface portion. The coating film may include an antireflection film and a resist film formed thereon. Furthermore, a substrate to be processed in the edge exposure apparatus may be such a substrate in that, after a coating liquid for antireflection film formation is applied on a substrate surface, an unnecessary antireflection film at an edge portion of the substrate is removed, a resist liquid is then applied on the antireflection film, and an unnecessary resist film at the edge portion of the substrate is thereafter removed.

In accordance with the present invention, an edge exposure method of performing an exposure process on an edge portion of a substrate having a coating film formed thereon includes the steps of: allowing a substrate holding portion to horizontally hold a substrate having a coating film formed on a surface thereof; detecting positional data of an outer edge of the substrate held by the substrate holding portion; moving an edge exposure portion relatively horizontally to the substrate held by the substrate holding portion based on the positional data of the outer edge of the substrate and performing an exposure process on an edge portion of the substrate by the edge exposure portion while performing alignment such that a positional relation between the outer edge of the substrate and the edge exposure portion is kept constant; and moving a developer supply portion relatively horizontally to the substrate held by the substrate holding portion based on the positional data of the outer edge of the substrate and supplying a developer to an exposed region of the edge portion of the substrate by the developer supply portion while performing alignment such that a positional relation between the outer edge of the substrate and the developer supply portion is kept. constant, thereby dissolving and removing the coating film in the exposed region.

A coating and developing method in accordance with the present invention includes the steps of: forming a coating film on a surface of a substrate; removing the coating film at an edge portion of the substrate using the edge exposure method as discussed earlier; performing a liquid immersion exposure process of performing exposure by forming a liquid layer on a substrate surface, on the substrate having the coating film at the edge portion removed; and performing a development process on the substrate subjected to the liquid immersion exposure process.

A storage medium in accordance with the present invention is used in an edge exposure apparatus performing exposure on an edge portion of a substrate having a coating film formed thereon for storing a computer program running on a computer. The computer program includes a step embedded to carry out the edge exposure method as discussed earlier.

In the edge exposure apparatus and the edge exposure method in accordance with the present invention as described above, edge exposure is performed on a coating film at an edge portion of a substrate, and a developer is then supplied to the edge-exposed region in the same apparatus, so that the unnecessary coating film at the edge portion of the substrate is removed in this apparatus. Therefore, during transportation to the next step, particle contamination resulting from peeling of the unnecessary coating film at the edge portion of the substrate can be prevented. In addition, the unnecessary coating film at the edge portion of the substrate is removed by an optical technique of exposing the edge portion of the coating film to photosensitive that region and then performing a development process thereby dissolving the photosensitized region, so that the coating film can be cut at high shape-accuracy to have a linear cross-sectional shape. Furthermore, positional data of the outer edge of the substrate is detected, and exposure is performed by the edge exposure means while alignment is performed based on the positional data such that the positional relation between the substrate and the edge exposure means is kept constant, so that the exposure width from the outer edge of the substrate is kept constant and the coating film at the edge portion of the substrate can be removed at high width-accuracy.

In addition, the coating and developing apparatus and the coating and developing method in accordance with the present invention includes the edge exposure apparatus and the edge exposure method, so that the unnecessary coating film at the edge portion of the substrate can be removed at high shape-accuracy and width-accuracy before an exposure process is performed in an exposure apparatus, thereby preventing particle contamination in the exposure apparatus resulting from peeling of the unnecessary coating film at the edge portion of the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a side cross-sectional view showing an edge exposure apparatus built in the coating and developing apparatus.

FIG. 8 is a schematic perspective view showing the edge exposure apparatus.

DESCRIPTION OF THE PREFERRED EMBODIMENTS

Figure 1:
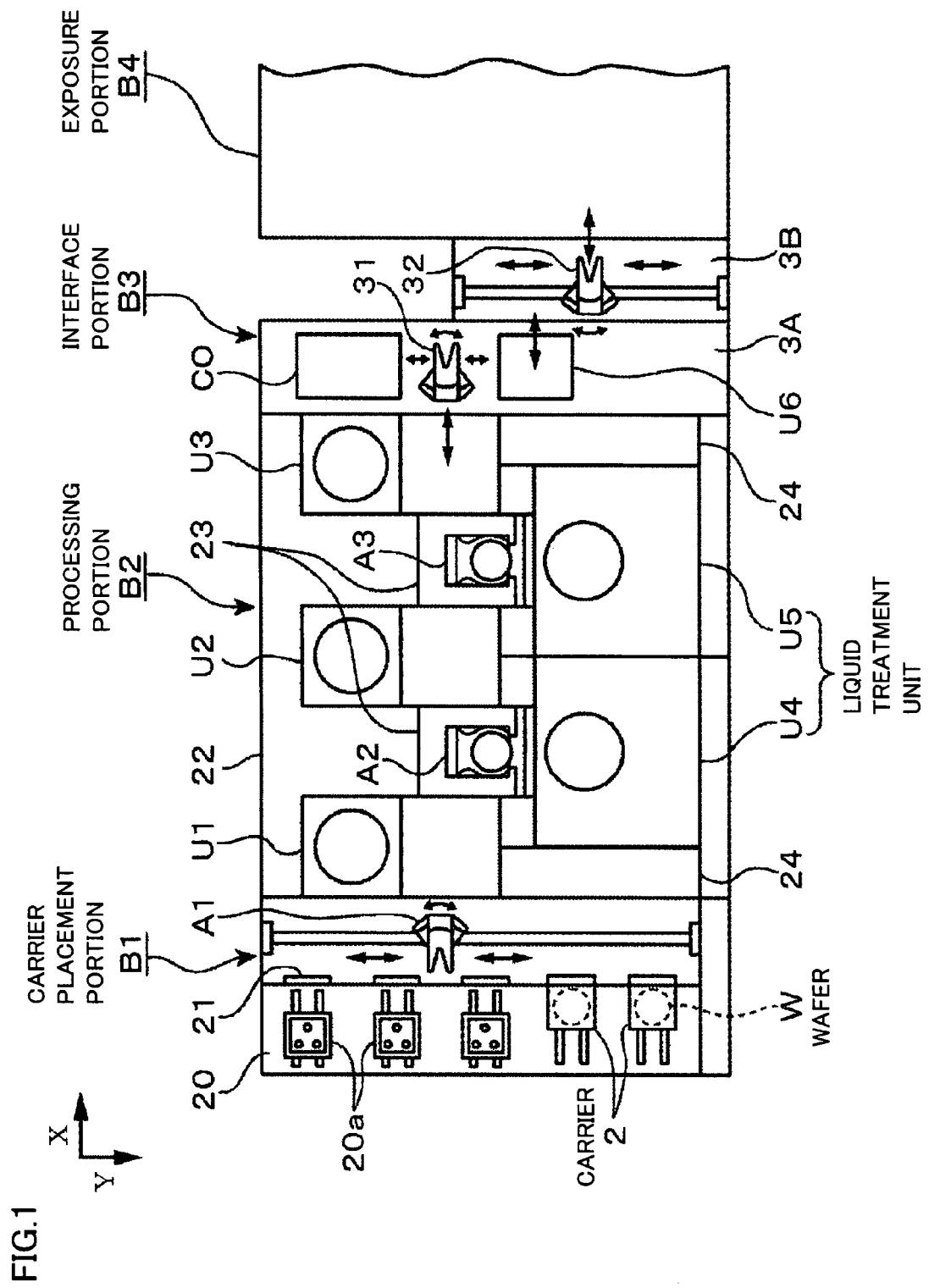
FIG. 1 is a plan view showing an embodiment of a coating and developing apparatus in accordance with the present invention.

First, with reference to FIG. 1 and FIG. 2, an overall configuration of a resist pattern formation system in which an exposure apparatus is connected to a coating and developing apparatus having an edge exposure apparatus of the present invention built therein will be described briefly. The figures show a carrier placement portion B1 for carrying in/out a carrier 2 hermetically accommodating substrates, for example, 13 wafers W. In carrier placement portion B1, provided are a carrier station 20 including a placement portion 20a on which a plurality of carriers 2 can be placed side by side, an opening/closing portion 21 provided on a front wall surface as viewed from carrier station 20, and delivery means A1 for taking out wafer W from carrier 2 through opening/closing portion 21.

At the back of carrier placement portion B1, a processing portion B2 enclosed with a casing 22 is connected. In this processing portion B2, shelf units U1, U2, U3 comprised of multiple stages of heating/cooling units, and main transport means A2, A3 delivering wafer W between each of shelf units U1-U3 and liquid treatment units U4, U5 are alternately arranged in order from the front side. In other words, shelf units U1, U2, U3 and main transport means A2, A3 are arranged in line from front to back as viewed from carrier placement portion B1. In each connection part, a not-shown opening portion for wafer transportation is formed to allow wafer W to freely move from shelf unit U1 on one end side to shelf unit U3 on the other end side in processing portion B2.

Main transport means A2, A3 are arranged in a space surrounded with a partition wall 23 comprised of one face on the side of shelf unit U1, U2, U3 arranged in line from front to back as viewed from carrier placement portion B1, one face on the side of liquid treatment units U4, U5 as described later, for example, on the right side, and a rear face portion which forms one face on the left side. The figures also show a temperature/humidity regulation unit 24 including a temperature regulation apparatus for treatment liquid used in each unit, a duct for temperature/humidity regulation, and the like.

Shelf units U1, U2, U3 are configured such that a variety of units for pre-treatment and post-treatment of a process performed in liquid treatment units U4, U5 are stacked in multiple stages, for example, ten stages. The combination includes a delivery unit, a temperature regulation unit (CPL) for regulating wafer W at a prescribed temperature, a heating unit (BAKE) for performing a heating process on wafer W before application of resist liquid, a heating unit (PAB) called a pre-baking unit or the like for performing a heating process on wafer W after application of resist liquid, a heating unit (POST) called a post-baking unit or the like for performing a heating process on wafer W after a development process.

Figure 2:
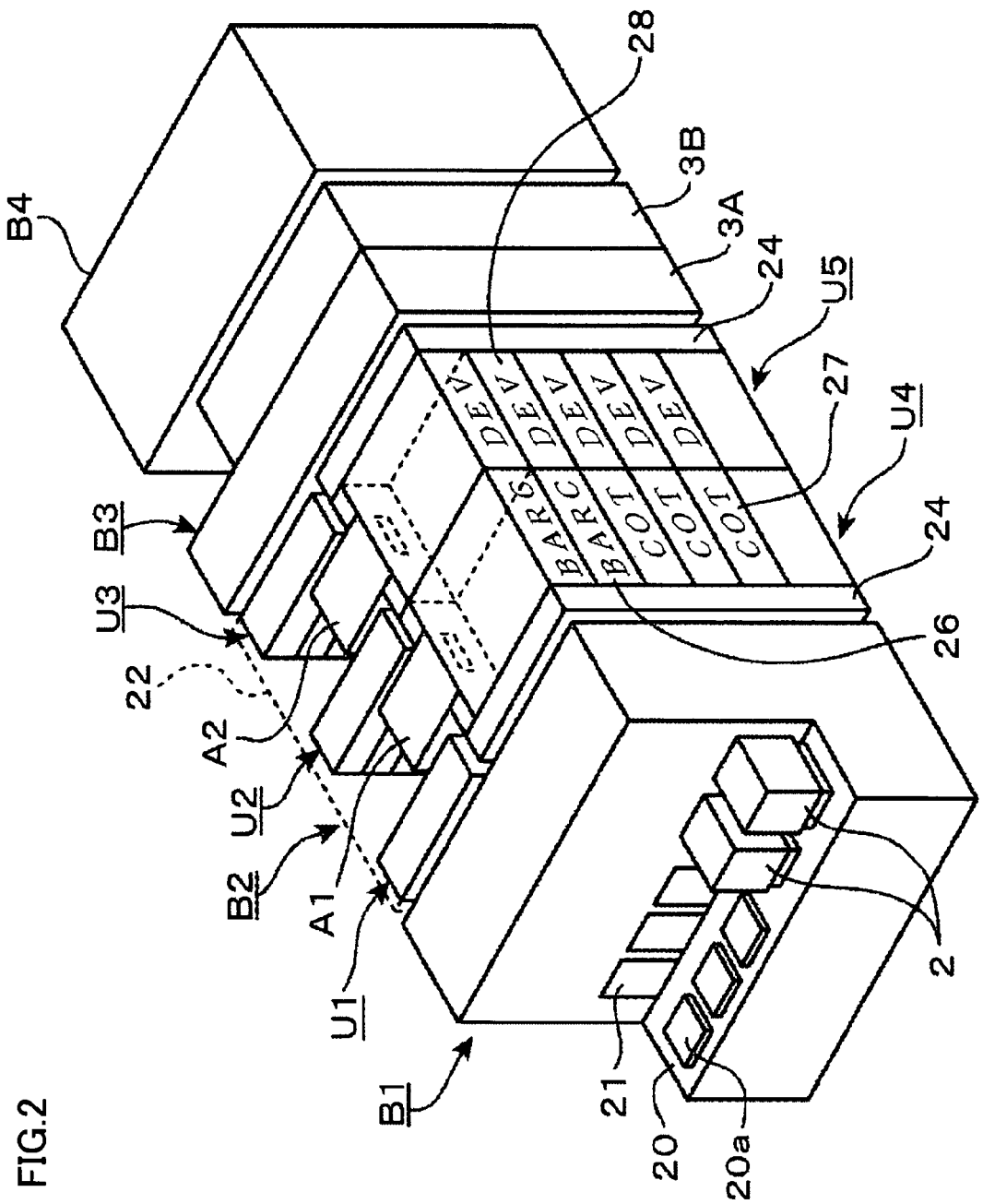
FIG. 2 is a perspective view showing the coating and developing apparatus.

Liquid treatment units U4, U5 are configured, for example, as shown in FIG. 2, such that an antireflection film formation unit (BARC) 26 for forming an antireflection film by applying a coating liquid for forming an antireflection film on wafer W, a coating unit (COT) 27 for forming a resist film by applying a resist liquid to wafer W, a development unit (DEV) 28 for performing a development process by supplying developer to wafer W, and the like are stacked in multiple stages, for example, in five stages.

At the back of shelf unit U3 in processing portion B2, an exposure apparatus B4 for performing, for example, liquid immersion exposure is connected with an interface portion B3 interposed. Interface portion B3 includes a first transport room 3A and a second transport room 3B provided on the front and back side between processing portion B2 and exposure apparatus B4 and respectively including a first transport arm 31 and a second transport arm 32 movable up/down, rotatable around the vertical axis, and movable forward/backward.

In addition, a shelf unit U6 is provided in first transport room 3A on the right side as viewed from carrier placement portion B1 with first transfer arm 31 interposed. In shelf unit U6, for example, edge exposure apparatus 4 of the present invention, a delivery unit, a high-accuracy temperature regulation unit (CPL), and a heating/cooling unit (PEB) for performing a post-exposure baking process on wafer W subjected to liquid immersion exposure, and the like are provided in such a manner as to be stacked above and below. It is noted that edge exposure apparatus 4, high-accuracy temperature regulation unit (CPL) and heating/cooling unit (PEB) may be provided in shelf units U1, U2, U3 of processing portion B2.

Figure 3:
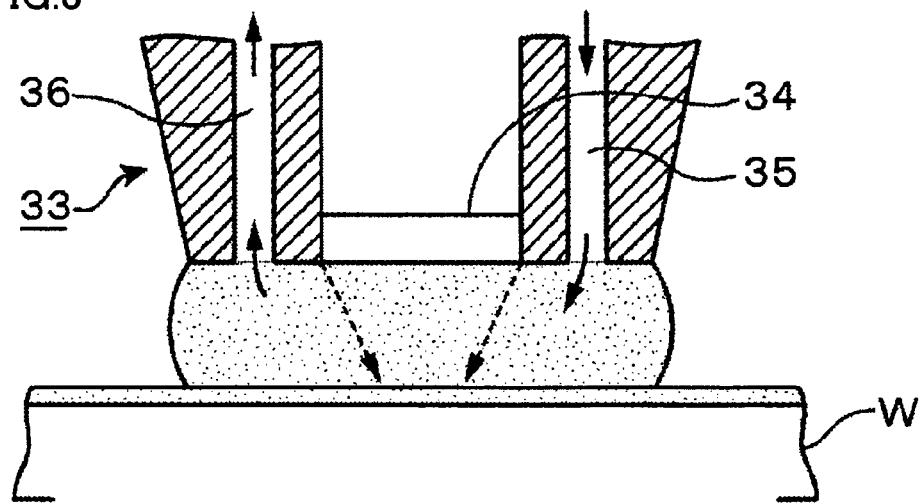
FIG. 3 is a side cross-sectional view illustrating liquid immersion exposure.

Referring to FIG. 3, exposure apparatus B4 for the liquid immersion exposure will be described briefly. Above wafer W held in a horizontal posture by a not-shown holding mechanism, an exposure means 33 is provided to oppose a front surface of wafer W with a gap. A lens 34 is inserted at a central tip end portion of exposure means 33. On the outer circumferential side of lens 34, a supply opening 35 for supplying a solution, for example, pure water for forming a liquid layer on the front surface of wafer W and a suction opening 36 for sucking and recovering pure water supplied to wafer W are provided. In this case, a liquid film (pure water film) is formed between lens 34 and wafer W by supplying pure water to the front surface of wafer W from supply opening 35 and recovering the pure water from suction opening 36. Then, light is emitted from a not-shown light source, and the light passes through lens 34 and transmits through the liquid film to be applied to wafer W, so that a prescribed resist pattern is transferred to the resist.

Figure 4:
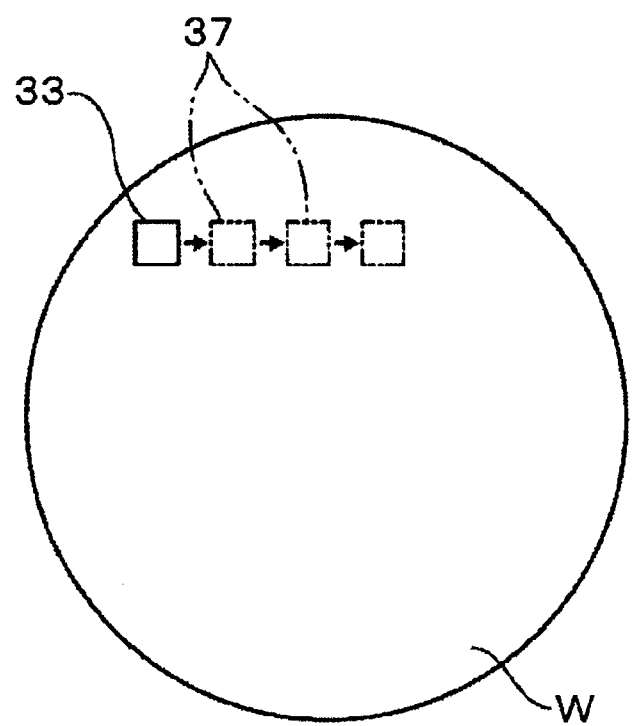
FIG. 4 is a plan view illustrating liquid immersion exposure.

Then, for example, as shown in FIG. 4, in the state where the liquid film is formed between lens 34 and the front surface of wafer W, exposure means 33 is slidably moved in a traverse direction so that exposure means 33 is arranged at a position corresponding to the next transfer region (shot region) 37 to be irradiated with light. By repeating this operation, a prescribed circuit pattern is successively transferred to the front surface of wafer W. It is noted that shot region 37 is depicted in a size larger than the actual size.

Figure 5:
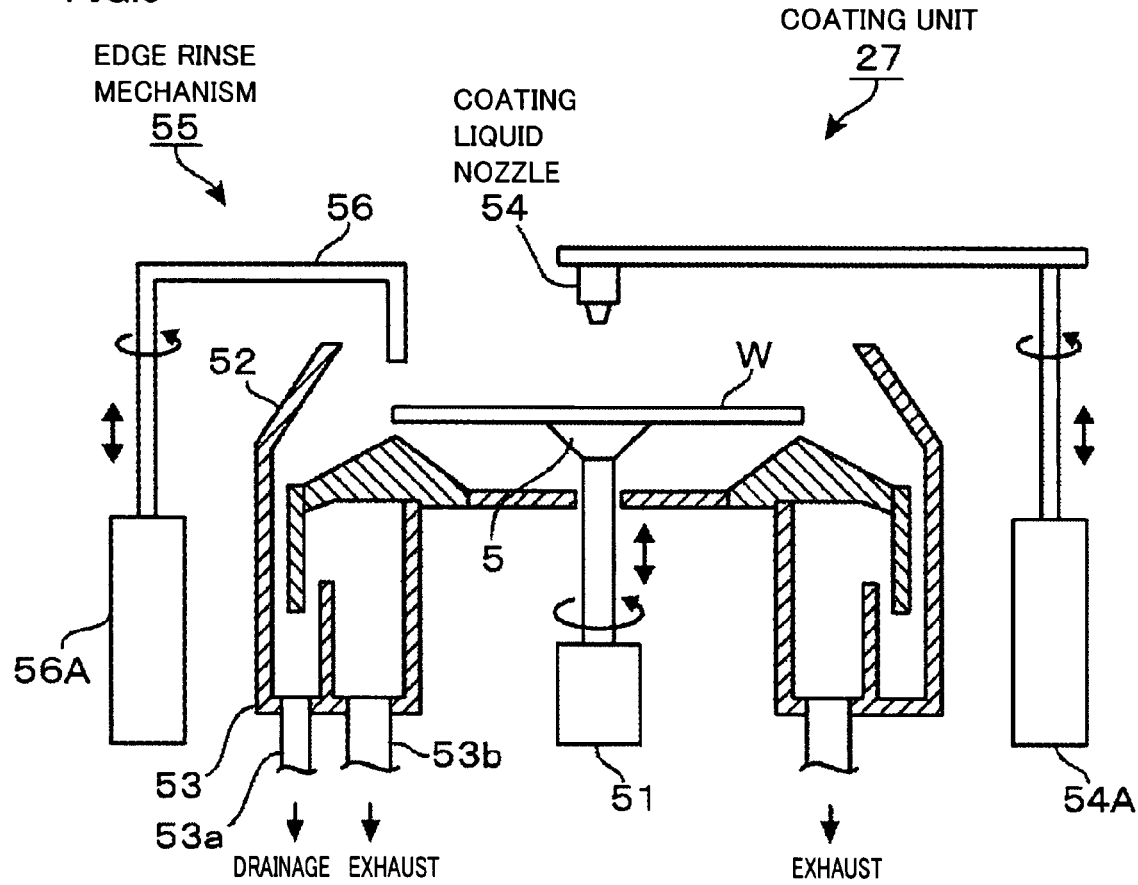
FIG. 5 is a side cross-sectional view showing a coating unit built in the coating and developing apparatus.

Next, coating unit 27 for performing a coating process of applying a resist liquid to wafer W will be described using FIG. 5. In FIG. 5, a spin chuck 5 is shown which forms a substrate holding portion for horizontally holding wafer W by vacuum suction at the central portion on the back surface thereof Spin chuck 5 is configured to be rotatable and movable up and down by a drive mechanism 51 with wafer W held. On the outside of the edge of wafer W held by spin chuck 5, a cup body 52 opened at the upper portion thereof is provided in such a manner as to surround wafer W. On the bottom portion side of cup body 52, a liquid reception portion 53 shaped like a concave portion is provided along the entire perimeter below the edge of wafer W. At the bottom portion, a liquid discharge channel 53a for discharging drainage such as the stored coating liquid and an exhaust channel 53b are connected.

In the figure, a coating liquid nozzle 54 is shown for supplying a resist liquid as a coating liquid to wafer W. Coating liquid nozzle 54 is configured, for example, to be movable up and down and rotatable between a processing position where resist liquid is supplied to the central portion of wafer W held by spin chuck 5 and a waiting position provided outside cup body 52, by a nozzle drive portion 54A.

In the figure, also shown is an edge rinse mechanism 55 for supplying a rinse liquid, for example, an organic solvent such as thinner to an edge portion outside a circuit formation region of wafer W held by spin chuck 5 to remove unnecessary resist liquid in that region. Edge rise mechanism 55 is configured with a rinse nozzle 56 for supplying a rinse liquid to wafer W held by spin chuck 5, and a drive portion 56A driving rinse nozzle 56 to be movable up and down and rotatable between a processing position where the rinse liquid is supplied to the edge portion of wafer W held by spin chuck 5 and a waiting position provided outside cup body 52.

In such coating unit 27, wafer W is held on spin chuck 5, and the resist liquid is applied by spreading the resist liquid on the front surface of wafer W by rotating wafer W while supplying the resist liquid as a coating liquid to the center of wafer W. Thereafter, unnecessary resist liquid at the edge portion of wafer W is removed by rotating wafer W while discharging a rinse liquid of an organic solvent to the edge portion of the front surface of wafer W from rinse nozzle 56.

Antireflection film formation unit 26 is also formed similar to coating unit 27. Wafer W is held on spin chuck 5, and a coating liquid for formation of an antireflection film is applied to the front surface of wafer W by rotating wafer W while supplying a coating liquid for formation of an antireflection film to the center of wafer W. Thereafter, unnecessary antireflection film at the edge portion of wafer W is removed by rotating wafer W while discharging a rinse liquid of an organic solvent to the edge portion of the front surface of wafer W from rinse nozzle 56.

An exemplary flow of wafer W in such a resist pattern formation system will be described with reference to FIGS. 6A-6D. Wafer W in carrier 2 placed in carrier placement portion B1 is transported through the path of temperature regulation unit (CPL)→ antireflection film formation unit 26 so that an antireflection film B is formed on the front surface of wafer W as described above (see FIG. 6A). Then, in antireflection film formation unit 26, after completion of application of a coating liquid for antireflection film formation as described above, an edge rinse process is performed, so that an unnecessary antireflection film at the edge portion is dissolved and removed by an organic solvent (see FIG. 6B).

Figure 6A:
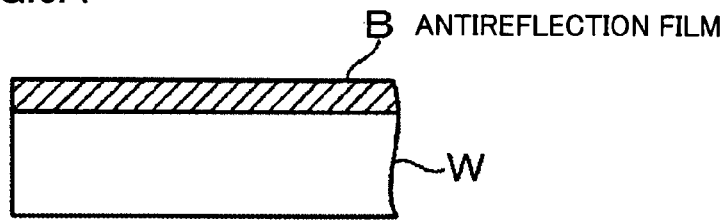
FIGS. 6A-6D are process views illustrating an action of the coating and developing apparatus.
Figure 6B:
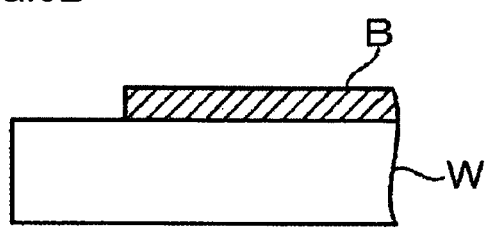
Figure 6C:
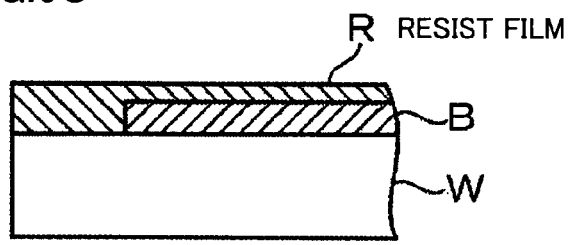
Figure 6D:
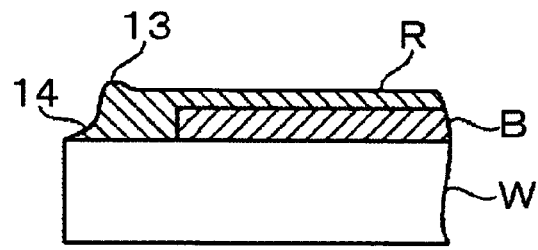

Then, wafer W is transported through the path of heating unit (BAKE)→temperature regulation unit (CPL)→ coating unit 27, so that a resist film R is formed on antireflection film B (see FIG. 6C). Then, in coating unit 27, after completion of application of a resist liquid as described above, an edge rinse process is performed, so that unnecessary resist film R at the edge portion is dissolved and removed by an organic solvent (see FIG. 6D). Here, FIG. 6D depicts that, as mentioned in the background art, part 13 where the resist film rises like a knot or part 14 where the resist film is thinly left due to liquid drip are produced at the edge portion of wafer W by the edge rinse process using an organic solvent. Thereafter, wafer W is transported through the path of heating unit (PAB)→ edge exposure apparatus 4, so that the unnecessary resist film at the edge portion is removed accurately, as described later.

Then, wafer W is transported to exposure apparatus 4, and liquid immersion exposure is performed with a liquid film of pure water, for example, formed on the front surface of wafer W. After the liquid immersion exposure process, wafer W is transported through the path of heating unit (PEB)→ high-accuracy temperature regulation unit (CPL)→ development unit 28 → heating unit (POST)→ temperature regulation unit (CPL)→ carrier 2 in carrier placement portion B1.

Now, an embodiment of edge exposure apparatus 4 in accordance with the present invention which is built in the aforementioned resist pattern formation apparatus will be described using FIG. 7-FIG. 12. As shown in FIG. 7, a spin chuck 41 is provided in the interior of a process container 40 and forms a substrate holding portion for horizontally holding wafer W by vacuum suction at the central portion on the back side thereof. Spin chuck 41 is connected to a drive mechanism 43 with an shaft portion 42 interposed therebetween. Drive mechanism 43 allows the held wafer W to be rotatable around the vertical axis and movable up and down between a first position (the position indicated by the dashed line in FIG. 7), for example, above a cup body 46 as described later, where positional data of the outer edge of the wafer is obtained and an edge exposure process is performed on wafer W and a second position (the position indicated by the solid line in FIG. 7) where wafer W is positioned in the interior of a cup body 46 and a liquid treatment is performed on wafer W.

The figure shows a base stage 44 provided to be guided by a guide rail 45 extending in the X direction in FIG. 8. Drive mechanism 43 is disposed on the top of base stage 44. Base stage 44 is configured such that it can move along guide rail 45 by a drive portion (not shown), for example, formed of a mechanism using a ball screw or a mechanism using a pulley and a belt. Thus, spin chuck 41 is configured to be movable in the X direction. In this example, base stage 44, guide rail 45 and the drive portion constitute alignment means.

On the outside of the edge of wafer W held by spin chuck 41, cup body 46 opened at the upper portion thereof is provided to surround wafer W, for example, in such a state in that it is attached to base stage 44. In FIG. 8, cup body 46 is not shown for the sake of convenience of illustration. The upper end side of the side circumferential surface of cup body 46 is inclined inwardly, and a liquid discharge channel 47 for discharging drainage such as the stored developer or cleaning liquid as described later is connected at the bottom portion of cup body 46. In this manner, cup body 46 is provided movably in the X direction together with spin chuck 41, and spin chuck 41 is provided movably up and down and rotatably, independently of cup body 46.

Figure 9:
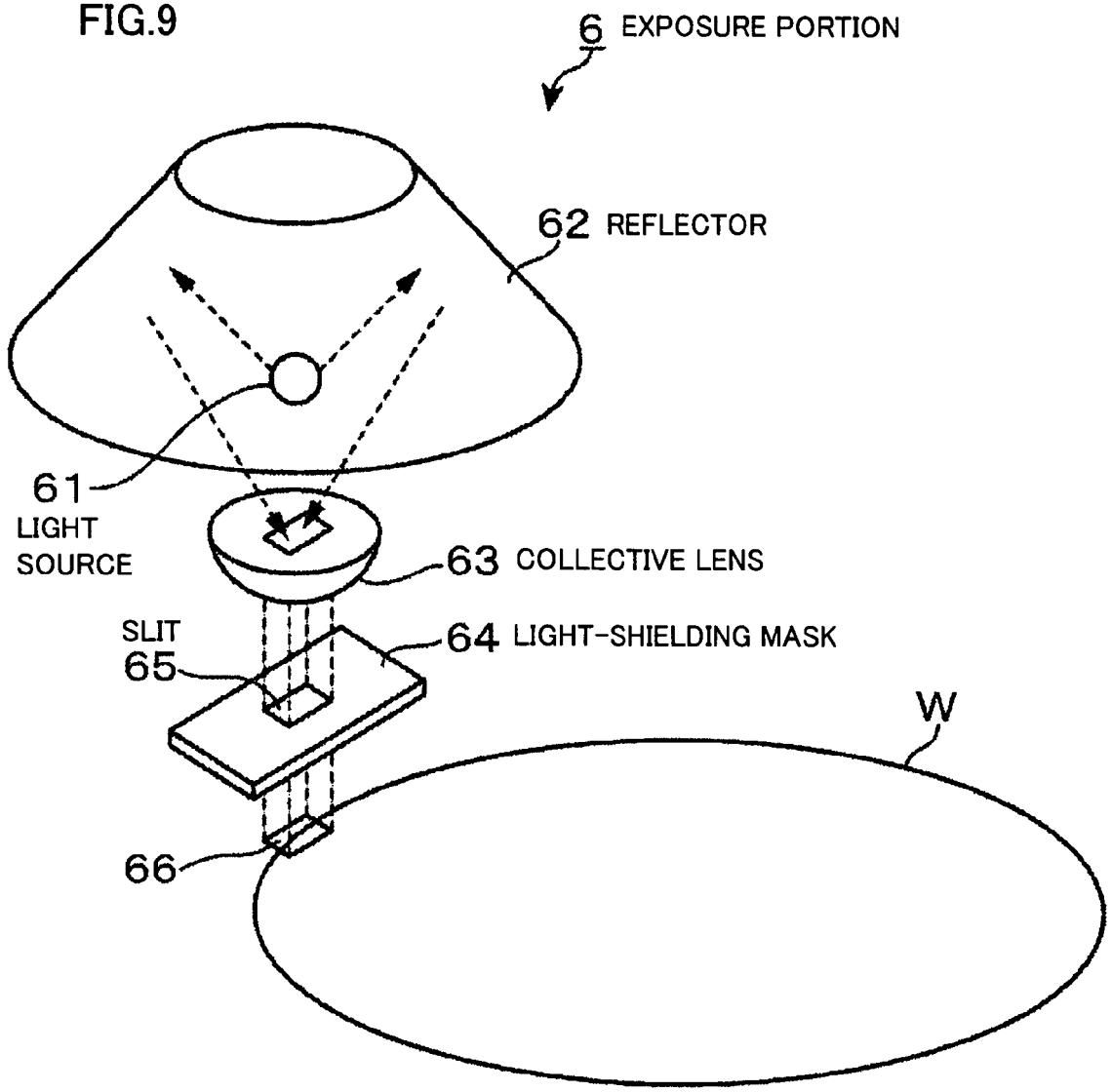
FIG. 9 is a schematic perspective view showing an exposure portion included in the edge exposure apparatus.

In FIG. 7, an exposure portion 6 is shown as edge exposure means. Exposure portion 6 is attached, for example, to process container 40 and has a light source 61, a reflector 62, a collective lens 63, and a light-shielding mask 64 including a slit 65, as schematically shown in FIG. 9. As light source 61, for example, a light source radially emitting light such as super high pressure mercury or xenon flash is used, and reflector 62 is provided in the surrounding of light source 61 to cover light source 61. Reflector 62 is configured to partially reflect light emitted from light source 61 so that the light is applied as a beam to an incident surface of collective lens 63. For example, plate-like light-shielding mask 64 is provided on the lower side of collective lens 63, and slit 65 having, for example, a rectangular shape is opened in light-shielding mask 64 to shape an exposure spot 66. Thus, in exposure portion 6, edge exposure is performed by applying a light beam emitted from light source 61 onto collective lens 63, collecting the light beam by collective lens 63 to direct the beam to the perimeter of slit 65, and applying the light beam transmitted through slit 65 to a radiation region at the edge portion of wafer W held on spin chuck 41.

Here, exposure portion 6 is disposed at such a position in that an intended radiation region of the edge portion of wafer W is always irradiated with an exposure beam from exposure portion 6 when wafer W is held on spin chuck 41 with the center of wafer W in alignment with the center of spin chuck 41, so that the edge portion of wafer W can be exposed with a preset uniform width.

In FIG. 7, position detection means 7 is shown. This position detection means 7 is means for detecting the position of the outer edge of wafer W and is configured with a position detection portion detecting the position of the outer edge of wafer W and a position detection portion drive mechanism driving this position detection portion. In this example, the position detection portion is formed of, for example, a CCD camera 71. This CCD camera 71 is supported by, for example, a U-shaped support member 72. This support member 72 is configured to be movable at wafer W above cup body 46 by position detection portion drive mechanism 73 in a horizontal direction between a detection position for CCD camera 71 to detect the position of the outer edge of wafer W and a waiting position outside cup body 46.

Then, wafer W is arranged at the first position above cup body 46, and CCD camera 71 is positioned such that the U-shaped support member 72 sandwiches the outer edge of wafer W from the outside. While the vicinity of the outer edge of the wafer is imaged by CCD camera 71, wafer W is rotated 360° at a rotational speed of, for example, about 100 rpm by spin chuck 41, thereby grasping the positional data of the entire perimeter of the outer edge of wafer W. In this example, for example, the positional data of the outer edge of wafer W is grasped as positional data of X and Y coordinate positions and is stored in control means as described later. It is noted that as a position detection portion other than CCD camera 71, a CCD sensor, a combination of a light emitting element and a light receiving element, or the like may be used.

In FIG. 7, a development nozzle 81 is shown for supplying a developer to the edge portion of wafer W held on spin chuck 41. Development nozzle 81 is configured, for example, to be movable up and down and rotatable between a developer supply position where a developer is supplied to wafer W and a waiting position outside cup body 46, by a development nozzle drive portion 82. In the figure, a cleaning nozzle 83 is also shown for supplying a cleaning liquid, for example, pure water to the edge portion of wafer W held on spin chuck 41. As cleaning nozzle 83, a pressure nozzle is used to eject a cleaning liquid in a pressure-regulated state at an ejection pressure of, for example, about 10 kPa-1 MPa. Such a cleaning nozzle 83 is configured, for example, to be movable up and down and rotatable between a cleaning liquid supply position where a cleaning liquid is supplied to wafer W and a waiting position outside cup body 46, by a cleaning nozzle drive portion 84.

Here, the aforementioned developer supply position and cleaning liquid supply position are positions for respectively supplying a developer and a cleaning liquid to a region of wafer W including a region subjected to the edge exposure when wafer W is held on spin chuck 41 with the center of wafer W in alignment with the center of spin chuck 41. A developer supply source 85 and a cleaning liquid supply source 86 are connected respectively to development nozzle 81 and cleaning nozzle 83 respectively through developer supply channel 85a, a cleaning liquid supply channel 86a, flow rate regulation portions V1, V2. In this example, development nozzle 81, development nozzle drive portion 82, developer supply channel 85a, flow rate regulation portion VI, and developer supply source 85 constitute developer supply means.

In the example as described above, position detection means 7, development nozzle 81 and cleaning nozzle 83 are provided at the respective positions where they do not interfere each other when moving between the detection position, the developer supply position, the cleaning liquid supply position and the waiting position. Then, a carry-in/out opening 48 for wafer W is formed on a side wall portion of process container 40, and wafer W carried in/out here is delivered to/from spin chuck 41, for example, at the first position.

This edge exposure apparatus 4 includes control means 100. Control means 100 includes a program storage portion, for example, formed of a computer. A software program, for example, having instructions embedded therein is stored in the program storage portion for carrying out the action of edge exposure apparatus 4 as described later, namely, control of processing of wafer W, delivery of wafer W and the like. The program is read out by control means 100 so that control means 100 outputs commands to drive mechanism 43 of spin chuck 41, the drive portion of base stage 44, exposure portion 6, flow rate regulation portions V1, V2, development nozzle drive mechanism 82, cleaning nozzle drive mechanism 84, and the like to control the action of edge exposure apparatus 4 as described later. It is noted that this program is stored, for example, in a storage medium such as a hard disk, a compact disk, a magneto-optical disk or a memory card.

Control means 100 controls the alignment means based on the positional data of the outer edge of wafer W which is obtained by position detection means 7, such that the positional relation between the outer edge of wafer W and exposure portion 6 at a time of an edge exposure process is kept constant, such that the positional relation between the outer edge of wafer W and development nozzle 81 at a time of developer supply is kept constant, and such that the positional relation between the outer edge of wafer W and cleaning nozzle 83 at a time of cleaning liquid supply is kept constant, with respect to wafer W held on spin chuck 41.

As discussed earlier, if wafer W is held on spin chuck 41 with the center of wafer W in alignment with the center of spin chuck 41, an exposure beam is always applied to an intended radiation region at the edge portion of wafer W from exposure portion 6, so that the edge portion of wafer W can be exposed with a uniform width. In addition, although the developer and the cleaning liquid are always supplied respectively from development nozzle 81 and cleaning nozzle 83 to the intended region at the edge portion of wafer W, wafer W is sometimes held on spin chuck 41 in a state in which the center of wafer W and the center of spin chuck 41 are not in alignment. Also in this case, this alignment operation is performed in order to expose the edge portion of wafer W with a uniform width and to supply the developer and the cleaning liquid respectively from development nozzle 81 and cleaning nozzle 83 to the intended region of the edge portion of wafer W.

Specifically, the alignment of exposure portion 6 at a time of edge exposure will be described as an example. As discussed earlier, the positional data of the X and Y coordinate positions of the outer edge of wafer W, which is detected by position detection means 7, is stored in a positional data storage portion 101 of control means 100. In control means 100, for example, a correction amount in the X direction of base stage 44 at a certain time is obtained by a correction amount calculation portion 102 from the X and Y coordinate positions of exposure portion 6, the rotational speed of wafer W and the time so that the positional relation between the outer edge of wafer W and exposure portion 6 is always kept constant in the edge exposure process, based on the positional data of the X and Y coordinate positions of the wafer outer edge.

In other words, exposure portion 6 is attached to process container 40 and its Y coordinate portion is fixed. Therefore, a correction amount in the X direction of base stage 44 is obtained by calculating the X coordinate position of exposure 6 at the Y coordinate position at a certain time and obtaining an amount of deviation from this value, so that the positional relation between the outer edge of wafer W and exposure portion 6 is kept constant, for example, so that the radiation region can always be exposed at a uniform width from the outer edge of wafer W. Then, a command is output from correction portion 103 to the drive portion of base stage 44 to move in the X direction by the correction amount. While base stage 44 is moved based on this along guide rail 45, spin chuck 41 is rotated. Thus, an edge exposure process is performed in the state in which the positional relation between the outer edge of wafer W and exposure portion 6 is always kept constant, whereby the edge portion of wafer W is exposed with a uniform width.

Similarly, a similar alignment operation is performed for development nozzle 81 at a time of developer supply and cleaning nozzle 83 at a time of cleaning liquid supply. While alignment means 7 is controlled respectively such that the positional relation between the outer edge of wafer W and development nozzle 81 at a time of developer supply is kept constant and such that the positional relation between the outer edge of wafer W and cleaning nozzle 83 at a time of cleaning liquid supply is kept constant, the developer and the cleaning liquid are always supplied respectively to the intended region of the edge portion of wafer W for the respective operations.

Figure 10A:
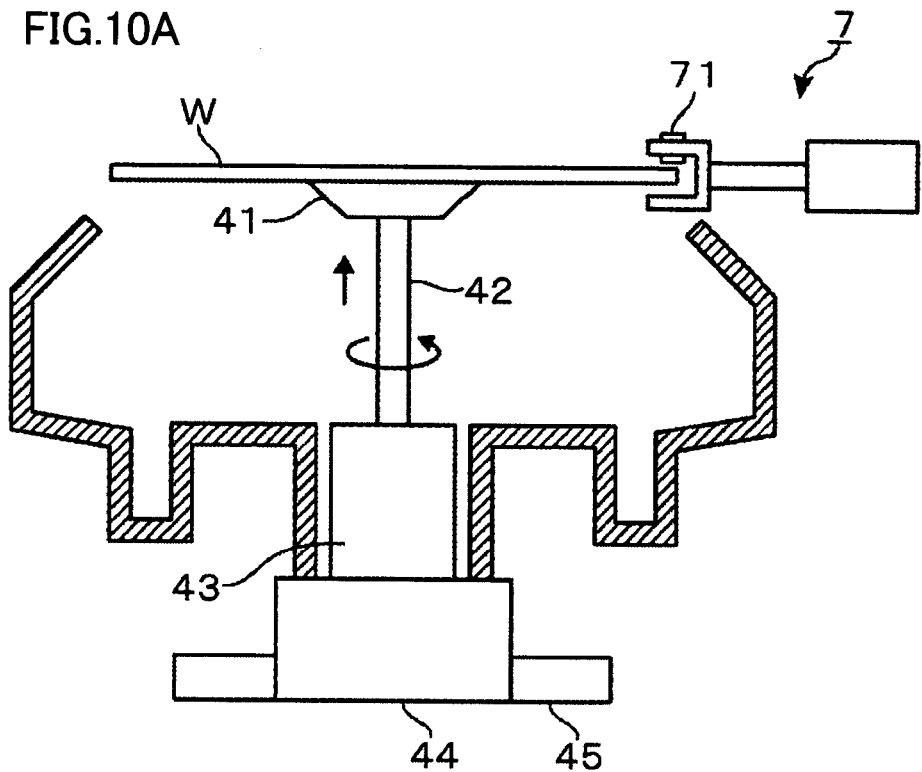
FIGS. 10A and 10B are process views illustrating an action of the edge exposure apparatus.

Now, the action of edge exposure apparatus 4 will be described with reference to FIG. 10A-FIG. 12D. As shown in FIG. 10A, wafer W is carried into process container 40 through carry-in/out opening 48 and delivered onto spin chuck 41 at the first position above cup body 46. Here, as for wafer W carried into process container 40, as shown in FIG. 6D as mentioned earlier, the unnecessary antireflection film at the edge portion is removed by an edge rinse process after a coating liquid for antireflection film is applied in antireflection film formation unit 26, and then the unnecessary resist film at the edge portion is removed by an edge rinse process after a resist liquid is applied in coating unit 27. In this example, a coating film is formed of antireflection film B and the overlying resist film R.

Then, while spin chuck 41 holding wafer W is kept at the first position, position detection means 7 is located at the detection position, and with spin chuck 41 rotated at a rotational speed of, for example, about 100 rpm, the positional data of the outer edge of wafer W is detected as positional data of the X and Y coordinate positions and stored in control means 100, as discussed earlier. In control means 100, the correction amount of spin chuck 41 in the X direction of base stage 44 at the time of edge exposure, the correction amount of spin chuck 41 in the X direction of base stage 44 at the time of developer supply, and the correction amount of spin chuck 41 in the X direction of base stage 44 at the time of cleaning liquid supply are obtained, as discussed earlier.

Figure 10B:
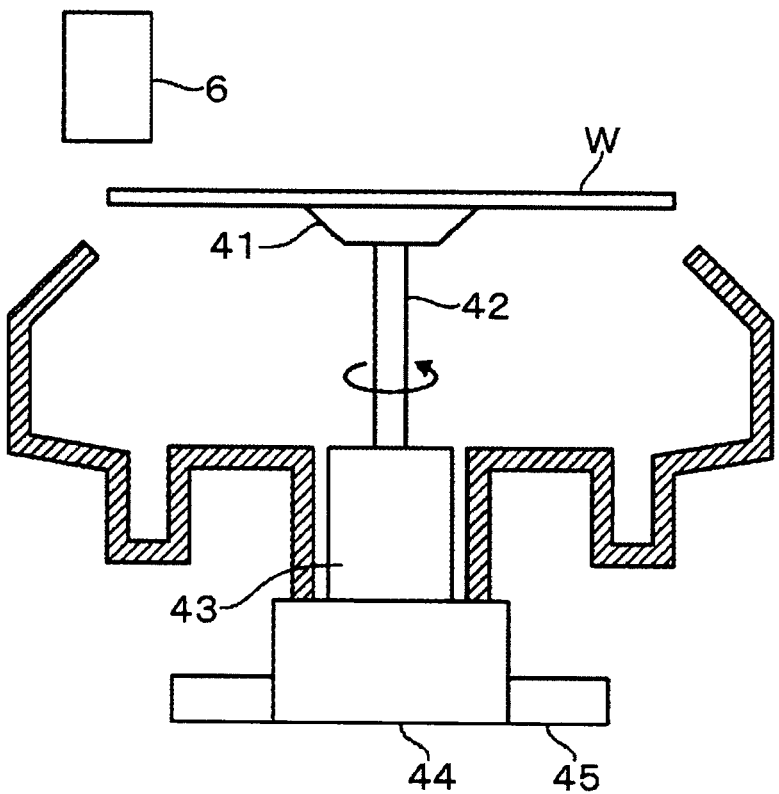
Figure 12A:
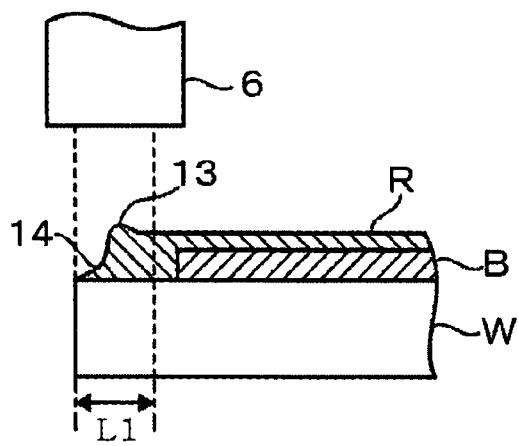
FIGS. 12A-12D are process views illustrating an action of the edge exposure apparatus.

Then, as shown in FIG. 10B, FIG. 12A, position detection means 7 is retreated to the waiting position outside cup body 46, and an exposure beam is applied from exposure portion 6 to the edge portion of wafer W. Spin chuck 41 is rotated while base stage 44 is moved by control means 100 along guide rail 45 by the amount corresponding to the correction amount so that the positional relation between the outer edge of wafer W and exposure portion 6 is kept constant, whereby the edge of wafer W is exposed at a uniform width L1.

Here, this width L1 is a distance from the wafer W outer edge to the inside by length L1 and corresponds to an exposure region. In this example, the width L1 is set to the size including knot-like part 13 and part 14 formed by liquid drip of resist film R. Therefore, the edge rinse width of antireflection film B and the edge rinse width of resist film R are set to include knot-like part 13 in the exposure region at the time of edge exposure process, whereby the width of edge rinse performed by an organic solvent in antireflection film formation unit 26 or coating unit 27 is set at a smaller distance from the wafer W outer edge and at a narrower width than the exposure region.

Figure 11A:
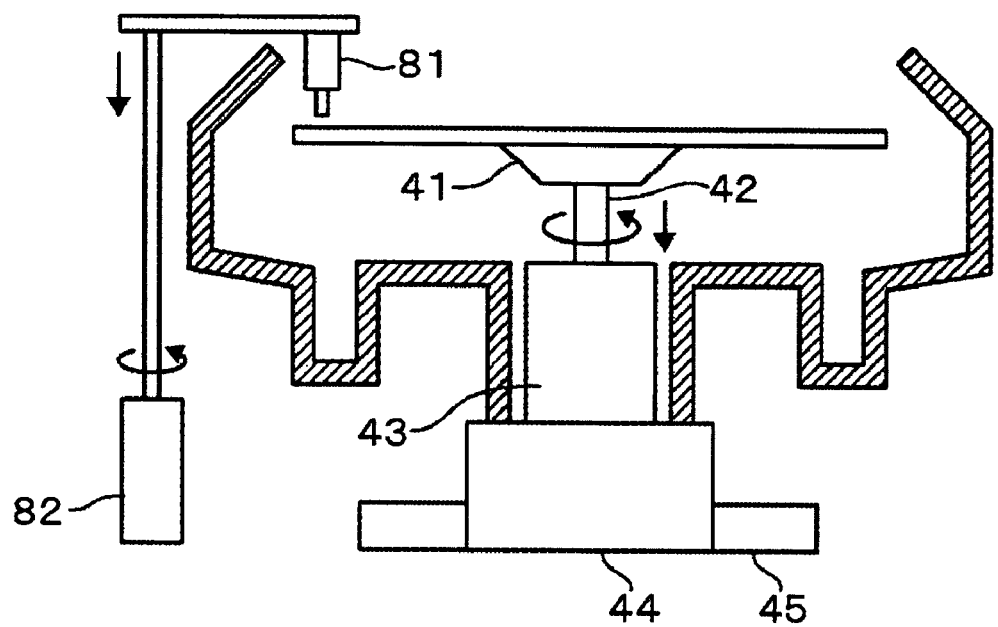
FIGS. 11A and 11B are process views illustrating an action of the edge exposure apparatus.
Figure 12B:
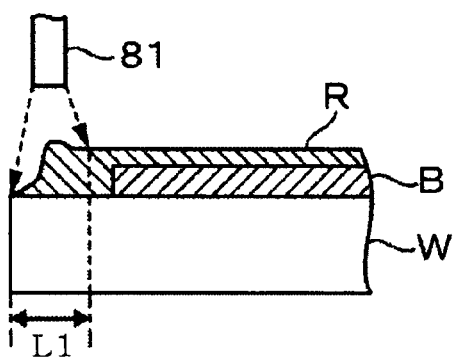

Then, as shown in FIG. 11A, FIG. 12B, spin chuck 41 holding wafer W is moved down to the second position inside cup body 46, and development nozzle 8 is located at the developer supply position so that a developer is ejected at a prescribed flow rate from development nozzle 81 toward the edge portion of wafer W. Here, the developer ejection region is a region including the exposure region (width L1). At this point, spin chuck 41 is rotated while base stage 44 is moved by control means 100 along guide rail 45 by the amount corresponding to the correction amount so that the positional relation between the outer edge of wafer W and development nozzle 81 is kept constant, whereby the developer is always supplied precisely to a prescribed region including width L1 of the edge portion of wafer W. Thus, in resist film R on the front surface of wafer W, unnecessary resist film R in the region exposed by exposure portion 6 is dissolved and removed by the developer.

Figure 11B:
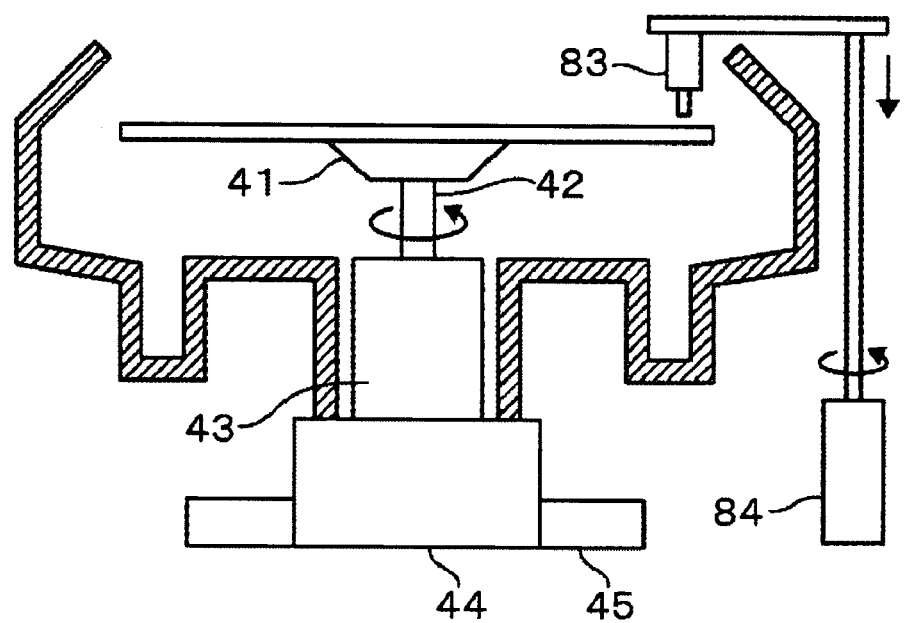
Figure 12C:
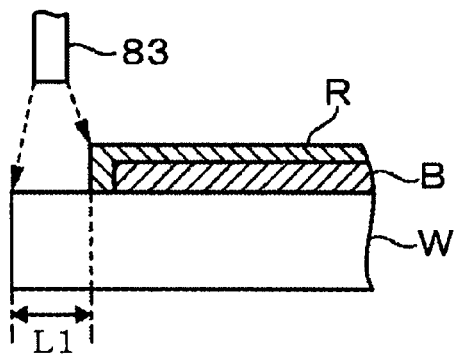

Then, as shown in FIG. 11B, FIG. 12C, development nozzle 81 is located at the waiting position and cleaning nozzle 83 is located at the cleaning liquid supply position so that a cleaning liquid at a prescribed flow rate is ejected from cleaning nozzle 83 toward the edge portion of wafer W at an ejection pressure of, for example, about 50 kPa. Here, the cleaning liquid ejection region is a region including the exposure region (width L1). At this point, spin chuck 41 is rotated while base stage 44 is moved by control means 100 along guide rail 45 by the amount corresponding to the correction amount so that the positional relation between the outer edge of wafer W and cleaning nozzle 83 is kept constant, whereby the cleaning liquid is always supplied precisely to a prescribed region including width L1 of the edge portion of wafer W. Since the cleaning liquid is supplied in a pressure-regulated state in the prescribed region, a dissolved component of the resist film left in the region and particles are removed quickly.

Figure 12D:
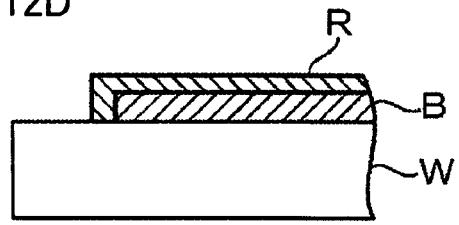
Figure 13A:
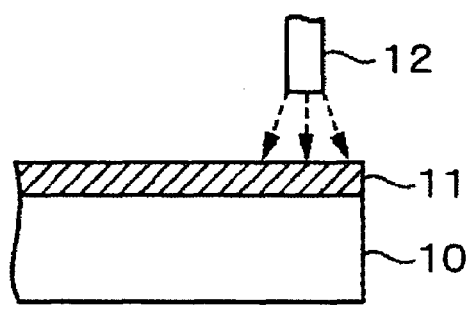
FIGS. 13A-13D are side cross-sectional views of a cleaning apparatus based on a conventional technique.
Figure 13B:
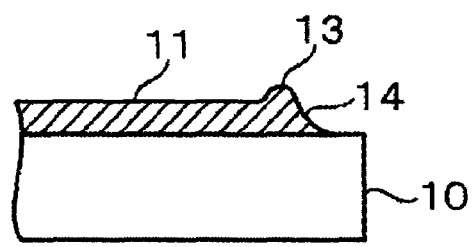
Figure 13C:
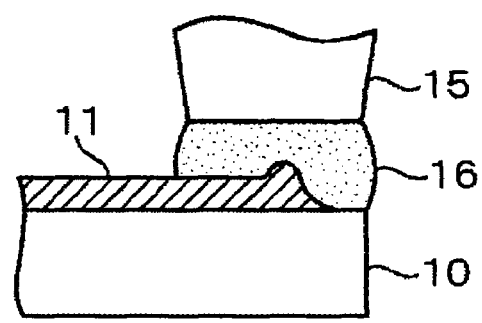
Figure 13D:
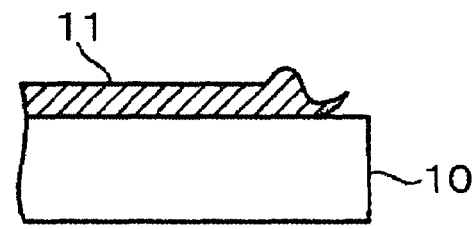

Then, as shown in FIG. 12D, cleaning nozzle 83 is located at the waiting position and wafer W is rotated at high speed, for example, at a rotational speed of about 1000 rpm whereby the front surface of wafer W is dried. Then, spin chuck 41 is moved up to the first position. Thus, wafer W, in which the edge exposure process and the development process are performed on unnecessary resist film R at the edge portion of wafer W and the unnecessary resist film R is removed, is transported to the next step by a not-shown transport arm through carry-in/out opening 48.

In such an edge exposure apparatus 4, edge exposure is performed on unnecessary resist film R at the edge portion of wafer W, and a developer is then supplied to the region subjected to edge exposure in the same apparatus, so that unnecessary resist film R at the edge portion of wafer W can be removed in one apparatus. Thus, it is not likely that the unnecessary resist film at the edge portion of wafer W falls off during transportation to the next step, resulting in particle contamination.

Here, the unnecessary resist film at the edge portion of wafer W is removed by an optical technique of exposing the edge portion of the resist film to photosensitize that region and then supplying a developer to the exposure region to dissolve the exposure region (photosensitized region), so that the compatibility between an organic solvent and a resist film, which is a problem in edge rinse using an organic solvent, does not matter, and the resist film can be cut with high shape-accuracy to have a linear cross-sectional shape, independently of the kind of resist film. In addition, the positional data of the outer edge of wafer W is detected, and an edge exposure process is performed while alignment is performed by moving spin chuck 41 based on this positional data so that the positional relation between wafer W and exposure portion 6 is kept constant. Therefore, the exposure width from the outer edge of wafer W is always kept constant, and the resist film at the edge portion of wafer W can be removed with high width-accuracy. Thus, the margin of the cut width, which is a problem in edge rinse using an organic solvent, does not have to be increased, so that a large circuit formation region of the resist film can be set.

Moreover, in a coating and developing apparatus having such an edge exposure apparatus 4 built therein, the unnecessary resist film R at the edge portion can be removed in edge exposure apparatus 4, so that it is not likely that the unnecessary resist film at the edge portion of wafer W falls off, for example, in the exposure apparatus to cause particle contamination resulting in a defect. Furthermore, even when a liquid immersion exposure process is performed in which water is brought into contact with wafer W for performing the process, knot-like part 13 or part 14 thinly left by liquid drip does not exist in resist film R. Thus, peeling of the resist film caused by these parts is not likely to occur, and such a situation can be prevented in that the peeling resist film reattaches to wafer W and is detected as a defect.

In addition, a removal process by edge rinse with an organic solvent is preliminarily performed on the unnecessary antireflection film B and resist film R at the edge portion of wafer W in antireflection film formation unit 26 and coating unit 27, so that attachment of antireflection film B and resist film R can be prevented during transportation from these antireflection film formation unit 26 and coating unit 27 to the unit in the next step. Therefore, in the transportation step to edge exposure apparatus 4 following formation of antireflection film B and formation of resist film R, particle contamination resulting from attachment of the coating film to the transport arm can also be prevented.

Here, in a case where the edge exposure process and the development process are performed on a stacked film of antireflection film B and resist film R in edge exposure apparatus 4, only the unnecessary resist film R at the edge portion of wafer W is removed. As for antireflection film B, knot-like part 13 or part 14 thinly extending due to liquid drip may be produced by an edge rinse process using an organic solvent in antireflection film formation unit 26. However, since resist R is formed over antireflection film B and the thickness of antireflection film B is about 50 nm-100 nm and is thinner than resist film R formed at a thickness of about 100 nm-200 nm, film peeling is less likely to occur at the time of liquid immersion exposure even if knot-like part 13 is produced.

In addition, since edge exposure apparatus 4 in accordance with the present invention is provided in the interface portion, wafer W processed in edge exposure apparatus 4 can be transported to exposure apparatus B4 immediately. Therefore, attachment of particles during transportation is prevented, and an exposure process can be performed in such a state in that particle contamination in exposure apparatus B4 is further reduced.

In the foregoing description, the present invention is applicable to an edge exposure process for wafer W having only a resist film formed as a coating film and is also applicable to an edge exposure process for wafer W having a protection film formed on a resist film as a coating film. Here, the protection film is formed after application of resist liquid to wafer W and before liquid immersion exposure in order to prevent the resist film from solving out to the liquid film side in performing a liquid immersion exposure process. For example, a water-repellent protection film is used in order to prevent the resist film from solving out and to make it difficult for the liquid in liquid immersion exposure to be left on the surface of wafer W.

In a case of a stacked film of a resist film and a protection film, formation of the resist film and removal of the unnecessary resist film at the wafer W edge portion by edge rinse with an organic solvent are carried out in the coating unit, and thereafter formation of the protection film and removal of the unnecessary protection film at the wafer W edge portion by edge rinse with an organic solvent are carried out in the protection film formation unit. Thereafter, in edge exposure apparatus 4, an edge exposure process and a development process are performed on the unnecessary protection film and resist film at the wafer W edge portion, whereby the unnecessary protection film and resist film in that region are removed. Here, since the protection film is a non-photosensitive film and is not affected even by exposure in the edge exposure process but is soluble in a developer, it is removed together with the resist film in the process in which the underlying resist film is exposed in the edge exposure process and the exposure region here is dissolved by a developer.

The exposure apparatus in accordance with the present invention is not limited to an exposure apparatus for performing a liquid immersion exposure process and is applicable to an exposure apparatus other than the exposure apparatus for performing a liquid immersion exposure process. The reason is that peeling of a resist film in an exposure process is prevented by removing the unnecessary resist film at the wafer edge portion in edge exposure apparatus 4 before performing an exposure process, resulting in an effect of preventing particle contamination in the interior of the exposure apparatus.

Although in the foregoing example, a cleaning liquid is supplied by cleaning nozzle 83 after supply of a developer, a cleaning liquid may be supplied to the edge portion of wafer W in a pressure-regulated state before an edge exposure process by exposure portion 6, whereby the part that may be a factor of film peeling is cleaned and removed beforehand by this water pressure.

In the foregoing example, at a time of developer supply and at a time of cleaning liquid supply, the developer and the cleaning liquid are supplied while the position of spin chuck 41 is adjusted by position adjustment means 7 so that the position relations between the outer edge of wafer W and development nozzle 81 and cleaning nozzle 83 are kept constant. However, the position adjustment of spin chuck 41 is not always necessary at a time of developer supply and at a time of cleaning liquid supply, as long as it is ensured that the developer and the cleaning liquid are supplied respectively from development nozzle 81 and cleaning nozzle 83 to the region including the exposure region. The reason is that the exposure region is correct, and as long as the developer or the cleaning liquid is supplied to the region including the exposure region, the unnecessary resist film at the wafer edge portion can be removed accurately with a uniform width.

In the foregoing example, spin chuck 41 may be provided movably in the X, Y directions, and spin chuck 41 may be moved in the X, Y directions based on the positional data of the wafer outer edge so that the positional relations between the outer edge of the wafer held on spin chuck 41 and exposure portion 6, development nozzle 81, cleaning nozzle 83 are kept constant. Alternatively, exposure portion 6, development nozzle 81 and cleaning liquid nozzle 73 may be provided movably in the horizontal direction, and the edge exposure process, supply of a developer, and supply of a cleaning liquid may be carried out while exposure portion 6 and the like are moved so that the positional relations between the outer edge of the wafer held on spin chuck 41 and exposure portion 6 and the like are kept constant.

In a case where means for detection by imaging from the front surface side of wafer W is provided as a position detection portion, such as CCD camera 71, support member 72 may not be formed in a U-shape since the outer edge of wafer W does not have to be sandwiched, and CCD camera 71 can be arranged on the front surface side of the wafer for performing position detection. Therefore, in this case, for example, CCD camera 71 and exposure portion 6 are provided movably between a prescribed position on wafer W and a waiting position outside cup body 46, and detection of the position of the wafer outer edge by position detection means 7 and an exposure process at the wafer edge portion by exposure portion 6 may be carried out with wafer W arranged at the second position inside cup body 46. Furthermore, spin chuck 41 of edge exposure apparatus 4 may be provided with an elevator pin formed to be movable up and down in order to deliver wafer W to/from spin chuck 41.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An edge exposure apparatus performing an exposure process on an edge portion of a substrate having a coating film formed thereon, comprising:
   a substrate holding portion horizontally holding a substrate having a coating film formed on a surface thereof;
   a position detection portion detecting positional data of an outer edge of the substrate held by the substrate holding portion;
   an edge exposure portion performing an exposure process on an edge portion of the substrate held by said substrate holding portion;
   a developer supply portion supplying a developer to an exposed region of the substrate held by said substrate holding portion and subjected to an exposure process at said edge portion, thereby dissolving and removing the coating film in said exposed region;
   an alignment portion moving the substrate held by said substrate holding portion and said edge exposure portion relatively horizontally to each other; and
   a control portion controlling said alignment portion such that a positional relation between the outer edge of the substrate and the edge exposure portion is kept constant, based on the positional data of the outer edge of said substrate, when an exposure process is performed by said edge exposure portion.

2. The edge exposure apparatus according to claim 1, further comprising a cleaning liquid supply portion supplying a cleaning liquid to said exposed region of the substrate held by said substrate holding portion and subjected to an exposure process at said edge portion thereby to clean the region.

3. A coating and developing apparatus comprising the edge exposure apparatus of claim 1, wherein, after a substrate carried into a carrier placement portion by a carrier is delivered to a processing portion and a coating film is formed on said substrate in the processing portion, an exposure process for an unnecessary coating film at an edge portion of the substrate and a development process for a region subjected to the exposure are performed in said edge exposure apparatus, the substrate is then transported to an exposure apparatus through an interface portion, and the substrate returned through said interface portion after an exposure process is subjected to a development process in said processing portion and delivered to said carrier placement portion.

4. The coating and developing apparatus according to claim 3, wherein said exposure apparatus is an apparatus performing a liquid immersion exposure process of performing exposure by forming a liquid layer on a substrate surface.

5. The coating and developing apparatus according to claim 3, wherein the edge exposure apparatus of claim 1 is provided in said interface portion.

6. The coating and developing apparatus according to claim 3, wherein said coating film includes an antireflection film and a resist film formed thereon.

7. The coating and developing apparatus according to claim 3, wherein a substrate to be processed in said edge exposure apparatus is such a substrate in that, after a coating liquid for antireflection film formation is applied on a substrate surface, an unnecessary antireflection film at an edge portion of the substrate is removed, a resist liquid is then applied on the antireflection film, and an unnecessary resist film at the edge portion of the substrate is thereafter removed.

8. An edge exposure method of performing an exposure process on an edge portion of a substrate having a coating film formed thereon, comprising the steps of:

allowing a substrate holding portion to horizontally hold a substrate having a coating film formed on a surface thereof;

then detecting positional data of an outer edge of the substrate held by said substrate holding portion;

then moving an edge exposure portion relatively horizontally to the substrate held by said substrate holding portion based on the positional data of the outer edge of said substrate and performing an exposure process on an edge portion of the substrate by said edge exposure portion while performing alignment such that a positional relation between the outer edge of said substrate and said edge exposure portion is kept constant; and then moving a developer supply portion relatively horizontally to the substrate held by said substrate holding portion based on the positional data of the outer edge of said substrate and supplying a developer to an exposed region of the edge portion of said substrate by the developer supply portion while performing alignment such that a positional relation between the outer edge of said substrate and said developer supply portion is kept constant, thereby dissolving and removing the coating film in said exposed region.

9. A coating and developing method comprising the steps of:

forming a coating film on a surface of a substrate;

removing the coating film at an edge portion of the substrate using the edge exposure method of claim 8;

performing a liquid immersion exposure process of performing exposure by forming a liquid layer on a substrate surface, on the substrate having the coating film at said edge portion removed; and performing a development process on the substrate subjected to said liquid immersion exposure process.

10. A storage medium used in an edge exposure apparatus performing exposure on an edge portion of a substrate having a coating film formed thereon for storing a computer program running on a computer, wherein said computer program includes a step embedded to carry out the edge exposure method of claim 8.

* * * * *